US008473904B1

(12) United States Patent
Sundararajan et al.

(10) Patent No.: US 8,473,904 B1
(45) Date of Patent: Jun. 25, 2013

(54) GENERATION OF CACHE ARCHITECTURE FROM A HIGH-LEVEL LANGUAGE DESCRIPTION

(75) Inventors: Prasanna Sundararajan, San Jose, CA (US); David W. Bennett, San Jose, CA (US); Robert G. Dimond, London (GB); Lauren B. Wenzl, Niwot, CO (US); Jeffrey M. Mason, Eldorado Springs, CO (US)

(73) Assignee: XILINX, Inc., San Jose, CA (US)

( * ) Notice: Subject to any disclaimer, the term of this patent is extended or adjusted under 35 U.S.C. 154(b) by 1562 days.

(21) Appl. No.: 12/009,272

(22) Filed: Jan. 16, 2008

(51) Int. Cl.
G06F 9/44 (2006.01)
G06F 12/00 (2006.01)
G06F 13/00 (2006.01)
G06F 13/28 (2006.01)

(52) U.S. Cl.
USPC .......................................... 717/114; 711/118

(58) Field of Classification Search
USPC ........................................................ 717/114
See application file for complete search history.

(56) References Cited

U.S. PATENT DOCUMENTS

| 6,370,622 | B1 * | 4/2002 | Chiou et al. | 711/146 |
|---|---|---|---|---|
| 6,631,447 | B1 * | 10/2003 | Morioka et al. | 711/141 |
| 7,017,014 | B2 * | 3/2006 | Cuomo et al. | 711/144 |
| 7,315,991 | B1 | 1/2008 | Bennett | |
| 7,325,232 | B2 * | 1/2008 | Liem | 718/102 |
| 7,664,928 | B1 | 2/2010 | Andrews et al. | |
| 7,689,972 | B2 * | 3/2010 | Sah et al. | 717/124 |
| 7,784,037 | B2 * | 8/2010 | Chen et al. | 717/143 |
| 8,180,964 | B1 * | 5/2012 | Koh et al. | 711/118 |
| 2003/0187935 | A1 * | 10/2003 | Agarwalla et al. | 709/206 |
| 2004/0030832 | A1 * | 2/2004 | Squibbs | 711/118 |
| 2004/0073630 | A1 * | 4/2004 | Copeland et al. | 709/218 |
| 2004/0148474 | A1 * | 7/2004 | Cuomo et al. | 711/144 |
| 2005/0055675 | A1 * | 3/2005 | Neifert et al. | 717/135 |
| 2005/0204316 | A1 * | 9/2005 | Nebel et al. | 716/2 |
| 2005/0251657 | A1 | 11/2005 | Boucher | |
| 2006/0136664 | A1 | 6/2006 | Trika | |
| 2007/0047126 | A1 | 3/2007 | Kobayashi et al. | |
| 2007/0261042 | A1 * | 11/2007 | Chen et al. | 717/148 |
| 2008/0127146 | A1 * | 5/2008 | Liao et al. | 717/150 |
| 2008/0155574 | A1 * | 6/2008 | Gohel et al. | 719/328 |
| 2008/0177975 | A1 | 7/2008 | Kawamura | |
| 2008/0229291 | A1 * | 9/2008 | Chen et al. | 717/140 |
| 2008/0307332 | A1 * | 12/2008 | Hayles et al. | 715/764 |
| 2009/0106256 | A1 | 4/2009 | Safari et al. | |
| 2010/0153654 | A1 * | 6/2010 | Vorbach et al. | 711/137 |

OTHER PUBLICATIONS

Putnam, Andrew et al., "CHiMPS: A High-Level Compilation Flow for Hybrid CPU/FPGA Architectures," *Proceedings of the 16th International ACM/SIGDA Symposium on Field-Programmable Gate Arrays*, Feb. 24-26, 2008, pp. 261-269, Monterey, California, USA.

(Continued)

*Primary Examiner* — Li B Zhen
*Assistant Examiner* — Arshia S Kia
(74) *Attorney, Agent, or Firm* — W. Eric Webostad; LeRoy D. Maunu

(57) ABSTRACT

Generation of cache architecture from a high-level language description is described. A description of an application in a high-level programming language is obtained. A data flow representation is generated from the description suitable for providing an implementation in hardware. The generating includes: identifying accesses to memory associated with the description; determining that at least a portion of the accesses to memory do not have one or more data dependencies for locally cacheable data; and assigning the portion to a distributed cache.

19 Claims, 5 Drawing Sheets

OTHER PUBLICATIONS

Ang et al., "ACRES Architecture and Compliation", HP Laboratories Palo Alto, HPL-2003-209(R.1), Apr. 2, 2004, title p. 81, Hewlett-Packard Company.

U.S. Appl. No. 11/064,401, Bennett, David W., filed Feb. 23, 2005, entitled "Compiling HLL into Massively Pipelined Systems", Xilinx, Inc. 2100 Logic Drive, San Jose, CA.

* cited by examiner

GENERATION OF CACHE ARCHITECTURE FROM A HIGH-LEVEL LANGUAGE DESCRIPTION

FIELD OF THE INVENTION

The invention relates to integrated circuit devices (ICs). More particularly, the invention relates to generation of cache architecture from a high-level language description.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAMs), multipliers, digital signal processing blocks (DSPs), processors, clock managers, delay lock loops (DLLs), and so forth. Of note, as used herein, "include" and "including" mean including without limitation.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

FPGAs have been used to accelerate applications. For example, FPGAs have been used in high-performance computing environments, among other known applications, where the FPGA architecture may be used to implement significantly pipelined systems. As used herein, by pipelined systems, it is generally meant a circuit involving at least one pipeline in which data is processed as one or more data streams. Thus, FPGA architectures may be used to build application-specific machines to execute many operations in parallel.

Conventionally, the data streaming model is used by FPGA application developers in their hardware compilation flow. Such a compilation flow conventionally involves an understanding of the circuitry to be implemented in programmable logic. For example, for a data streaming application, data in memory may be read out sequentially such that data may be continuously read and fed to a pipeline for processing. Such sequential reads of data may involve scheduling, which may involve a fairly in-depth understanding of operating parameters of the circuit to be implemented in programmable logic of the FPGA.

In contrast to the hardware compilation flow conventionally used for FPGAs, a programming model for microprocessors conventionally does not involve such an in-depth understanding of the operation of the processor. Moreover, software engineers may specify instructions to be carried out by a processor or processors using a high level language ("HLL"). Examples of such HLLs are C, C++, FORTRAN, and Java, among others. After a software engineer has written source code for an application to be carried out by a processor or processors, the application is conventionally compiled and debugged with a debugger. The compiled application may be assembled by an assembler to provide machine level language code. Of note, each of these operations may be performed within a software development environment, separate from the hardware development environment associated with programming FPGAs.

In order to exploit parallelism capable of being implemented in an FPGA, software engineers converted from the software development environment to the hardware development environment in order to transition from the programming model to the hardware model. This conversion involved an in-depth understanding of the circuits' operation by the software engineer and was often a very daunting task. In order to use an HLL source code to generate a configuration bitstream for an FPGA, HLL source code was compiled using compilers that are adapted for providing circuits following the data streaming model. Thus, for HLL source code written with a microprocessor memory model in mind, this meant converting the HLL source code to a data streaming model suitable for use with such compilers. Generally, in a microprocessor memory model, input data to be operated by a microprocessor is available for random access from disk or memory. This is a more conventional stored relation model for example as between microprocessor and memory. In contrast, in a data streaming model, some or all input data to be operated on by a circuit operator is not available for random access, but rather arrives sequentially as one or more continuous data streams.

Accordingly, it would be desirable and useful to provide means to transition a programming model more smoothly to provide a description of circuits that may be implemented in an FPGA without having to substantially convert an application from the programming model to a data streaming model.

SUMMARY OF THE INVENTION

One or more aspects generally relate to integrated circuit devices (ICs) and, more particularly, to generation of cache architecture from a high-level language description.

An aspect relates generally to a method for generating architecture for a circuit. A description of an application written in a high-level programming language is obtained. A data flow representation is generated from the description suitable for providing an implementation in hardware. The generating includes identifying accesses to memory associated with the description; determining that at least a portion of the accesses to memory do not have one or more data dependencies for locally cacheable data; and assigning the portion of the accesses to memory to a distributed cache.

Another aspect relates generally to a method for converting source code. A spatial compilation is generated from the source code suitable for providing an implementation in hardware with a distributed cache. The generating includes identifying accesses to memory associated with the source code; determining which of the accesses to memory do not have one or more data dependencies for locally cacheable data; and assigning at least a portion of the accesses to memory without the one or more data dependencies to separate memories to provide the distributed cache.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels may be used in different diagrams to refer to the same items; however, in alternative embodiments the items may be different.

Generally, cache architecture is thought of as having local cache memory located between a microprocessor and a larger main or system memory, where the local cache memory is conventionally SRAM and the system memory is conventionally DRAM. However, as used herein, cache architecture refers to distributing local cache memory throughout a circuit in contrast to being bound to the microprocessor.

As described below in additional detail, an application written in an HLL does not have to be tailored to work with a compiler targeted at a data streaming model. Rather, a compiler that is compatible with a microprocessor memory model architecture may be used. Thus, additional work for converting an application written in a HLL to work with a compiler directed at data streaming model may be avoided, as the code would not have to be tailored to the data streaming model compiler.

In the following description, it will become apparent that an application written with HLL source code may be compiled without having to convert the source code to a data streaming model. In addition, it will become apparent that code previously written for execution by microprocessors, namely written for a microprocessor or microprocessors memory model, may be directly compiled for instantiation in an FPGA. It will be further appreciated that such an application so instantiated in an FPGA effectively may be considered more of an application-specific circuit. In other words, an application written in an HLL source code, which previously may have been targeted for a microprocessor memory model along the lines of a general purpose adaptation, is converted based on the compilation to a circuit which is tailored to the application.

Figure 1:
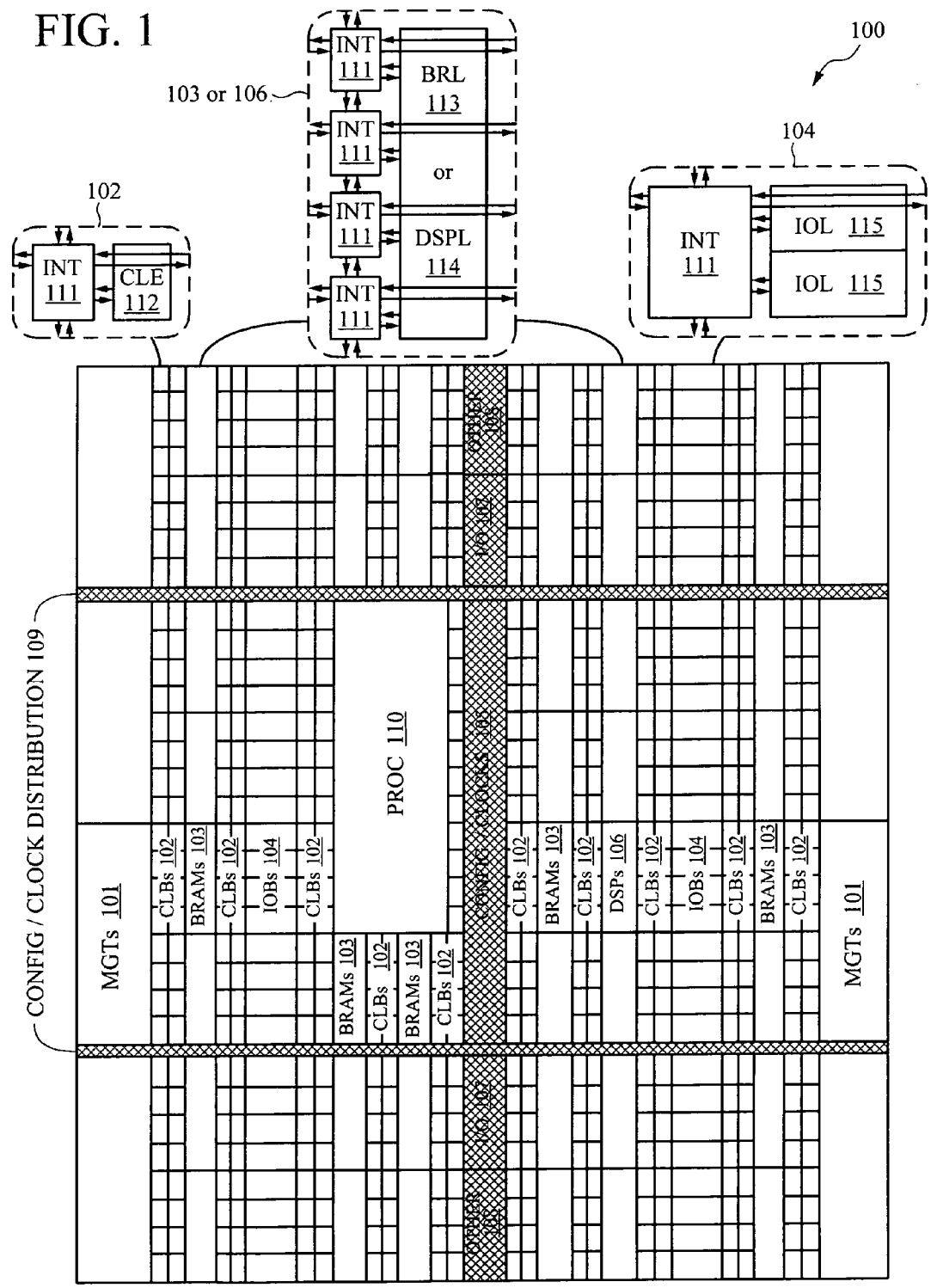
FIG. 1 is a simplified block diagram depicting an exemplary embodiment of a columnar Field Programmable Gate Array (FPGA) architecture in which one or more aspects of the invention may be implemented.

As noted above, advanced FPGAs can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown crosshatched in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block PROC 110 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

While the following description is in terms of instantiating a circuit compiled from HLL source code into an FPGA, it will be appreciated by one of ordinary skill in the art of this technology that any integrated circuit may be defined as an application-tailored circuit responsive to compilation as described herein. In other words, even though the example of instantiating an application in programmable logic coupled to embedded memory of an FPGA is described, it should be appreciated that the same compilation may be used to produce an application specific integrated circuit ("ASIC"). Thus in effect, an application which may have been written for a general purpose microprocessor memory model may be instantiated as an application-tailored circuit in an FPGA or as a stand alone ASIC, or other application-directed implementation.

Figure 2:
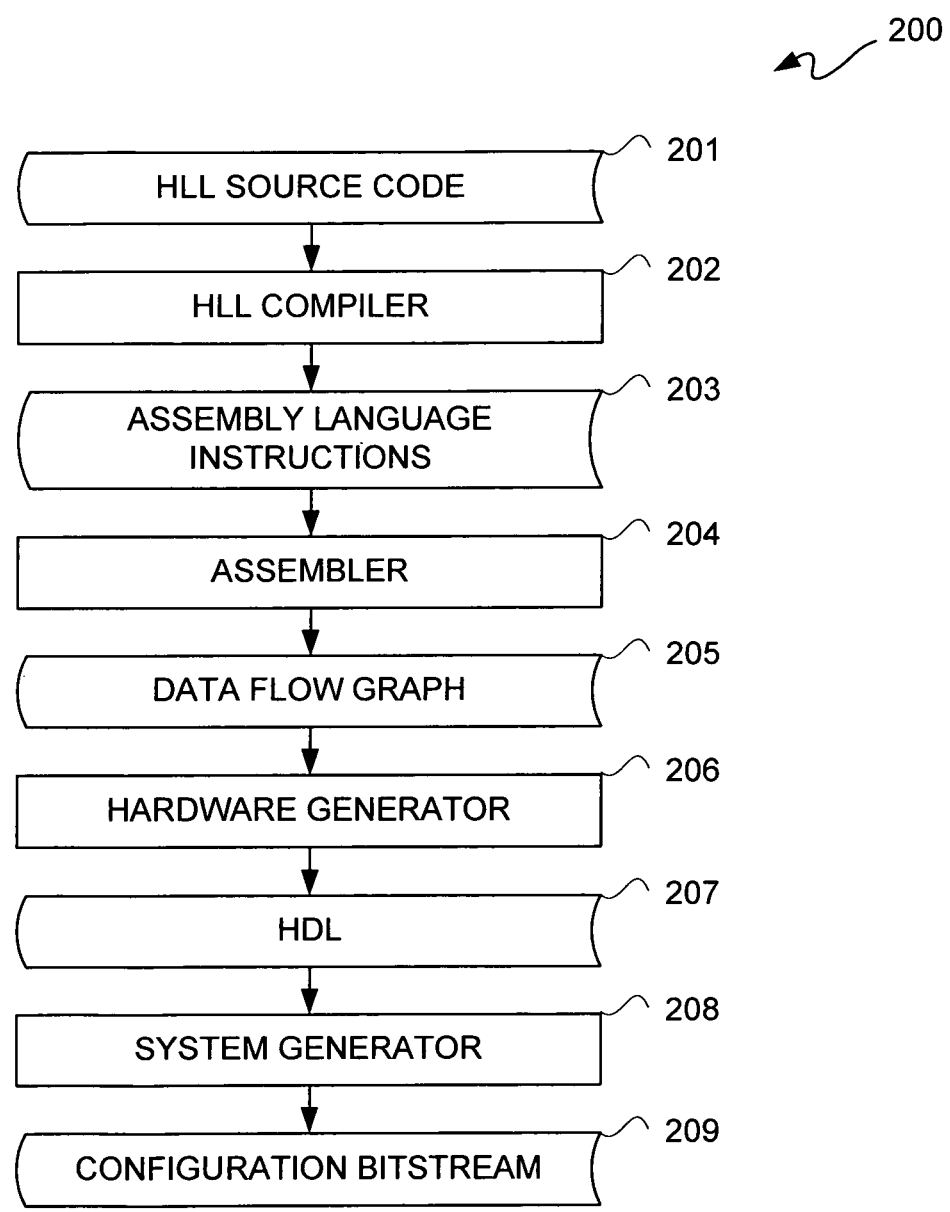
FIG. 2 is a block/flow diagram depicting an exemplary embodiment of a compilation flow for a Compiling High Level Language to Massively Pipelined System ("CHiMPS") that has been adapted to provide a distribution cache.

FIG. 2 is a block/flow diagram depicting an exemplary embodiment of a compilation flow 200. Compilation flow 200 starts with source code written in an HLL at 201. At 202, the HLL source code is compiled by an HLL compiler. The HLL compiler is not directed at a data streaming model, as described below herein in additional detail, but is directed at a spatial compilation. By spatial compilation, it is generally meant generation of application directed systems where data and control are stored near their uses for transmission over small distances. An example of a spatial compiler is the ACRES Spatial Compiler as described in "ACRES Architecture and Compilation," by Boon Seong Ang and Michael Schlansker, published by the Hewlett-Packard Company in 2004 (at URL: //hpl.hp.com/techreports/2003/HPL-2003-209R1.pdf). Thus, HLL source code, which may have previously been written for a general purpose microprocessor memory model or a spatial association of compute elements, may be used.

For a spatial compilation, compute elements are unrolled for the hardware, where such compute elements operate on data present on their inputs. This increases parallel or concurrent operation, such as may be implemented in a pipelined architecture. In such a pipelined architecture, computational elements may operate at lower frequencies though with multiple computations executed in parallel on data sets within a same clock cycle. Additionally, data dependency status for data involved in compute element operations is determined to identify compute operations having no data dependency. Thus, data associated with such compute operation having no data dependency may be stored in a local cache with respect to a compute element or compute elements performing the compute operation. The ability to locally cache data allows such data locality to be exploited. By facilitating multiple instructions being executed in parallel with data locality, memory bottlenecks, namely where memory throughput is lower than data consumption rate of an accelerator circuit, may be avoided. By locally cacheable data, it is not meant all data. For example, in the computer language C, locally cacheable data types include array data types, pointer data types, structure data types, and global data types. While the embodiments described herein are not limited to these data types in C, it should be understood that not all data is locally cacheable data as described herein. Thus, conventionally temporary scalar data stored in a register file in a microprocessor is not locally cacheable data. Moreover, conventionally data which is stored in "main memory" is locally cacheable data.

It shall be appreciated that memory accesses are random memory accesses in contrast to data streaming accesses. However, instructions compiled by an HLL compiler may be those of a traditional microprocessor Instruction Set Architecture ("ISA") for microprocessor chip set. In addition to such instructions, performance may be enhanced by additional tailoring due to the availability of programmable logic not available with a general purpose microprocessor.

Caches facilitate exploitation of data locality. FPGAs, which conventionally have BRAMs or may be configured with look-up table random access memories ("LUTRAMs"), may be used as described below in additional detail to implement a distributed cache. The distributed cache may be used to provide data locality with respect to computational circuits of an application or design. Heretofore, distributed caching was not advocated for implementation in an FPGA, as it undermined the more performance driven data streaming model. However, ease of use may be facilitated by a distributed cache, as the more well-known software programming model for writing source code for microprocessors may be used.

In a conventional software application, memory accesses actually are not random but may be correlated. Thus, locality of memory accesses, spatial locality, and temporal locality, may be associated with such correlation. Spatial locality conventionally means that data for an operation is accessed and there is likelihood that neighboring data will also be accessed for the same operation. Temporal locality conventionally means that data which has recently been accessed is likely to be accessed again within the near future. A distributed cache may take advantage of spatial locality by having sets of data immediately available to a compute operation for which they are used, and by caching such data, temporal locality may be facilitated. Caches as used in microprocessor architecture are well known. It should be appreciated that such caches are fixed general purpose caches which are not tailored to a specific application to be executed on the general purpose microprocessor.

Patterns of memory accesses may be unchanged by an implementation of an accelerator in an FPGA as described herein even though the same software which may have previously been used for execution in a microprocessor memory model, is executed in an FPGA instantiation of the application. However, by having a distributed cache, data locality may be enhanced along with overall system performance. In fact, multiple memory accesses may be supported in parallel, unlike a conventional microprocessor system. Furthermore, unlike a conventional multi-microprocessor system with shared memory, multiple memory accesses may be facilitated with less arbitration.

As described herein in additional detail, an HLL compiler is configured to create multiple caches which may be specific to an application being compiled. These multiple caches may support multiple memory accesses, which may be concurrent. Furthermore, such caches may be parameterized to be more tailored to the application being compiled.

An HLL compiler that may be adapted for providing a distributed cache is Compiling High Level Language to Massively Pipelined System ("CHiMPS"). A CHiMPS target language ("CTL") is the output language of an HLL compiler. Compilation flow 200 is for CHiMPS that has been adapted to provide a distributed cache. Thus, in flow 200, HLL source code is compiled into CTL and then data flow architecture is generated from the CTL. In contrast to non-adapted CHiMPS, the data flow architecture of adapted CHiMPS uses a distributed cache in addition to first-in/first-out buffers ("FIFOs"). Thus, in contrast to what was previously done in a non-adapted CHiMPS, the pipelines having read and write instructions, any number of which may be operated in parallel depending on data dependency constraints in an application, are partitioned into read and write instructions between multiple caches. All or some of these multiple caches may be coherent depending upon the data uses of the application. Thus, reads and writes may be allocated to different caches to facilitate data locality, as well as execution in parallel. Of course, reads and writes associated with a same cache may be serviced in sequence using an arbitration protocol. Additional detail regarding a non-adapted CHiMPS compiler may be found in a co-pending application entitled "Compiling HLL into Massively Pipelined Systems" by David W. Bennett, filed on Feb. 23, 2005, and assigned application Ser. No. 11/064,401 which is incorporated by reference herein in its entirety.

HLL compiler 202, which in this example is an adapted CHiMPS as described above, compiles HLL source code 201 to provide assembly language instructions 203. Assembly language instructions 203 are provided as input to assembler 204. Responsive to assembly language instructions 203, assembler 204 provides a data flow graph 205. Data flow graph 205 may be input to a hardware generator 206 for generating a hardware description language code (HDL) 207. HDL 207 may be input to a system generator 208 to provide a configuration bitstream 209.

HLL compiler 202 may be configured to assign all memory operations to a single cache, or alternatively allow a programmer to assign different caches by modifying cache identification (ID) values generated by HLL compiler 202. A restrict keyword in the C programming language for example may be used by a programmer to qualify an array such that HLL compiler 202 is informed that such an array or a memory location thereof is non-aliased. HLL compiler 202 may, though need not, be configured to support restrict operations. However, if restrict operations are supported, HLL compiler 202 may generate different cache IDs in the presence of multiple arrays. This may be done by modifying a CTL file generated by HLL compiler 202 to identify arrays for separate caches. Alternatively, rather than modifying a CTL file, a separate file may be used to identify arrays for separate caches.

Assembly language instructions 203 facilitate creation of multiple caches as part of compilation flow 200. An example format for a read instruction may be:
read     <cacheid>;[<tapid>];[<width>];<address>;[<sync-in>];<data>[;sync-out>]

This read instruction is presented as a pseudo-instruction for coupling a FIFO (not shown) for an address register identified in such instruction to a read tap address input. The FIFO for the data register identified in the read instruction is coupled to a tap output register. Responsive to a FIFO receiving a value for an associated address, such value may be automatically directed to a read tap to initiate processing. However, this does not necessarily mean that the data FIFO will be ready when a next instruction calls for data. Thus, it is possible that the consumer of such data will be blocked waiting for a read to finish.

HLL compiler 202 may assign a cache ID value for a read instruction, as well as a tap ID value. The cache ID value identifies to which cache the read is directed. Of note, HLL compiler 202 may be configured to make informed decisions based on input source code, namely to identify which instructions are more likely to access memory, and in particular which instructions are more likely to access the same cache. Alternatively, rather than relying on HLL compiler 202, a programmer may embed such information for HLL compiler 202 to indicate which instructions are more likely to access the same cache.

A tap identifier in a read instruction is a number from 0 to (N−1), where N indicates a number of available taps in a multi-ported memory. There may be a multiple of read ports, a multiple of write ports, or a combination of multiples of read and write ports. A tap identifier indicates which tap for a cache memory is to be used. As used herein, the phrase "cache" may be assumed to mean random access memory. A cache controller may read data for a lowest tap number first, such that HLL compiler 202 may assign numbers in reverse order in assembly language instructions 203.

Sync-in and sync-out in a read instruction facilitate execution of reads and writes within a 'specified pipeline or thread in a proper order. If there are no data dependencies between reads and writes, a particular read and write may, though need not, occur in the same order in which they are specified in assembly language instructions 203. This is because order is dependency-based, which allows for operations that are not interdependent, namely operations that do not have data dependencies upon one another, to be executed concurrently. As described herein, separate memories or non-overlapping memory spaces in multi-ported memories are assigned to each read or write, or at least a portion of either the reads or writes, or both, in the assembly language instructions. Thus, for example, a read instruction having no data dependency and being associated with only locally cacheable data may be assigned a RAM in a programmable logic device, which is not shared. Furthermore, for example, a read instruction having no data dependency and being associated with only locally cacheable data may be assigned a separate memory space in a multi-ported RAM in a programmable logic device, which is shared though the sharing does not preclude concurrent reads therefrom. Assembler 204 may be unable to track external memory dependencies; accordingly, sync registers (not shown) used for sync-in and sync-out may be used for tracking such dependencies with respect to external memory.

Actual values in sync-in and sync-out registers need not actually be used. Rather the presence of data in FIFOs may provide synchronization. Of note, such FIFOs may be "zero-bit-wide" FIFOs if there is hardware to support such a configuration. A read instruction may be paused until data is in a sync-in FIFO before actually executing a read from such FIFO. Once data in a sync-in FIFO is available, data may be entered into a sync-out FIFO, which may be simultaneous with entry of data into a data FIFO.

In an example format of a write instruction, the following fields may be included:

write <address>;<write value>;<word width>;[;[<sync-in>][;sync-out>]]

A write command causes a value to be written into a memory controller at an identified location in memory. The address field in a write instruction is an operand which identifies a physical address for the start of data to be written into memory. The word width field identifies how many bytes of data are to be written starting at such starting address. The write value field is for an operand. If bit width of the memory is different from the value in the word width field, the write value may be used for padding or truncating the data in order to fit the bit width of the physical memory data interface for such a write.

Sync-in and sync-out registers, which may be implemented as FIFOs (not shown), may be used to synchronize memory accesses. Actual values in such sync-in and sync-out FIFOs need not be used; rather, the presence of data in such FIFOs may be used for synchronization. A write instruction may be paused until there is data in a sync-in FIFO before initiating execution of a write. Once a write command has been executed, at least with respect to one or more local caches, data may be transferred to a sync-out FIFO. Of note, the read instruction and the write instruction may be indicated as a "memread" instruction and a "memwrite" instruction, respectively.

Multiple loop iterations may be executed at the same time and sync-in and sync-out may be used to ensure that the reads and writes within an iteration happen in an intended order. If a cache ID is specified in a read or write instruction, such cache ID identifies to which cache a read or write is to be directed. If a write instruction specifies multiple cache IDs, namely multiple locations to which data is to be written, then those identified caches may be updated with the written memory. Additionally, external memory may be updated for data coherency. If no cache ID is specified, all caches may be notified of a write to external memory for purposes of erasing or deleting associated information in those caches, namely deleting data in one or more lines of those caches. In other words, if no caches are specified, the write may go directly to off-chip memory. Of note, this may be used to force cache lines, which are otherwise flagged for being presently in use, to be written from such caches to external memory before sync-out is issued or otherwise asserted.

Figure 3A:
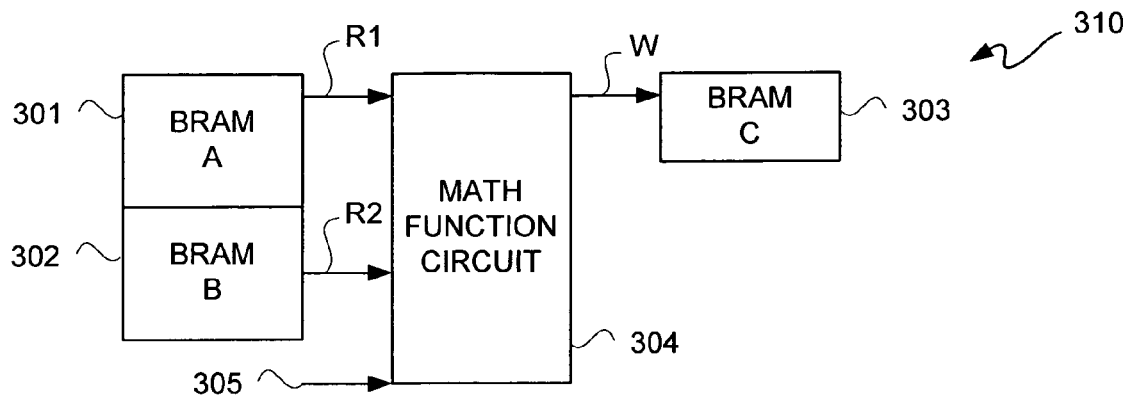
FIGS. 3A, 3B, and 3C are block diagrams depicting respective alternative exemplary embodiments of circuits which may be implemented responsive to output of CHiMPS of FIG. 2.

FIG. 3A is a block diagram depicting an exemplary embodiment of a circuit 310 which may be implemented responsive to output of HLL compiler 202 of FIG. 2. Compiler 202 may identify read instructions R1 and R2 and a write W instruction in a line of source code. HLL compiler 202 may thus assign BRAM 301 and BRAM 302 for storage of data A associated with read instruction R1 and for data B associated with read instruction R2, respectively.

A math function circuit 304, which may be implemented in programmable logic, may receive a command signal 305 for carrying out a mathematical operation on data read responsive to read instructions R1 and R2 having addresses for BRAMs 301 and 302, respectively. Of note, even though BRAMs are used, as such BRAMs are generally available in an FPGA, such as BRAMs 103 of FPGA 100 of FIG. 1, other forms of random access memory may be used. Furthermore, for an FPGA implementation, LUTRAMs may be used. After performing each operation on data obtained responsive to read instructions R1 and R2, math function circuit 304 may issue a write instruction W for writing result data C from math function circuit 304 to BRAM 303 starting at an address specified by W.

Of note, it is not necessary that each read instruction and each write instruction be associated with a separate memory, such as BRAMs 301 through 303, for purposes of data locality.

Figure 3B:
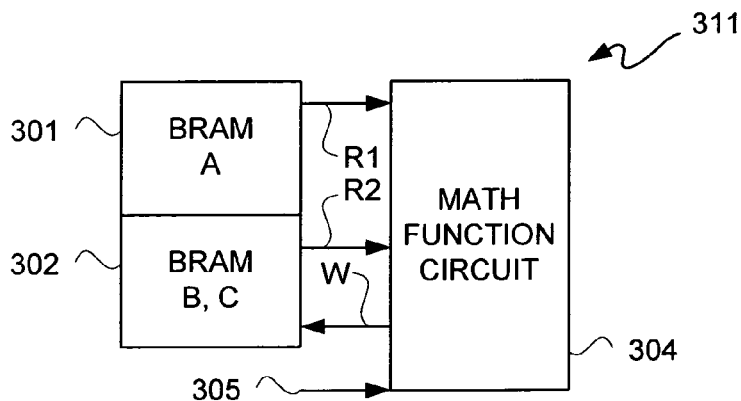

FIG. 3B is a block diagram depicting an exemplary embodiment of a circuit 311 which may be implemented in an FPGA responsive to output from HLL compiler 202. In this circuit, reads R1 and R2 are still assigned to BRAMs 301 and 302, however, write instruction W is assigned to BRAM 302 for writing result data C thereto.

Figure 3C:
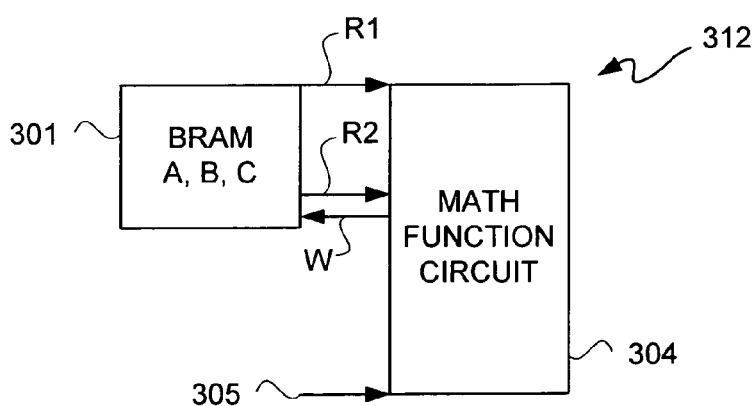

FIG. 3C is a block diagram depicting an exemplary embodiment of a circuit 312 which may be implemented in an FPGA responsive to output from HLL compiler 202. In FIG. 3C, read instructions R1 and R2, as well as write instruction W, are assigned to BRAM 301. Of note, for executing reads in this example in parallel, BRAM 301 may be a multi-ported BRAM. Alternatively, if multi-porting is not available, multiplexing circuitry may be provided on the input or output end, or both, of a memory for providing multi-port capability.

Figure 4:
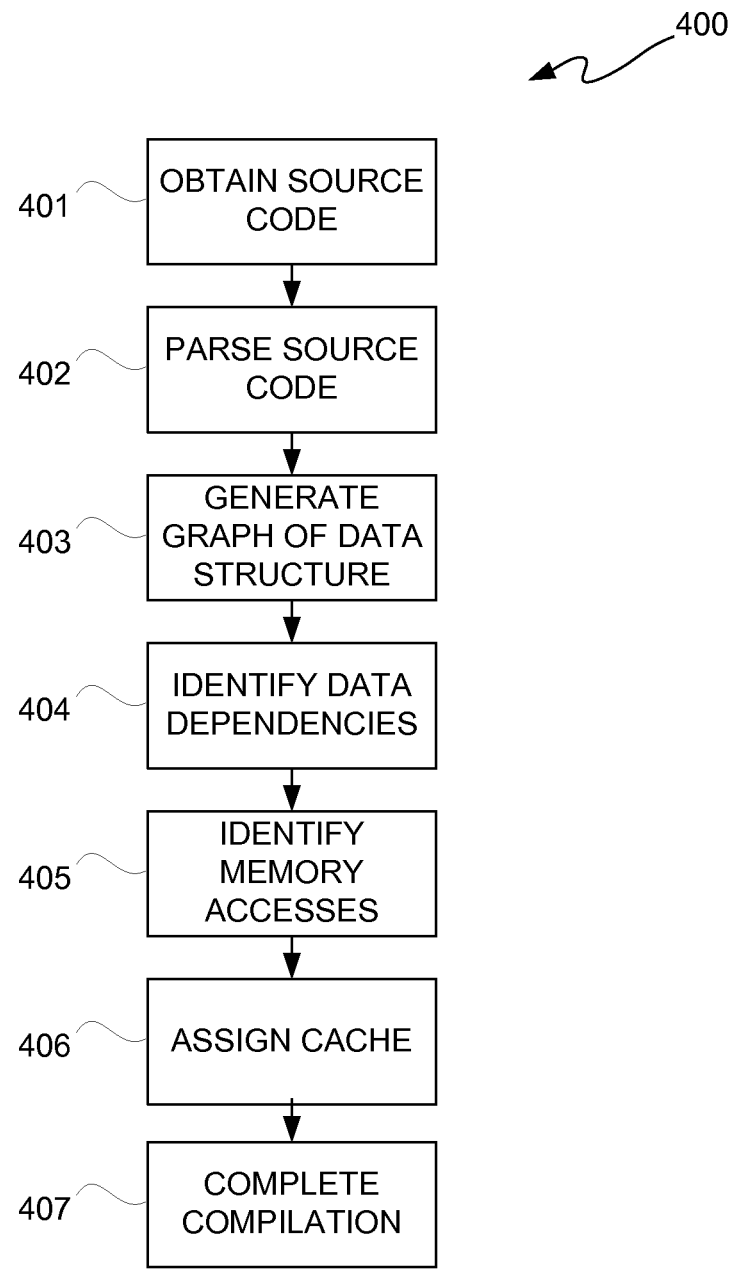
FIG. 4 is a flow diagram depicting an exemplary embodiment of an application-specific partitioning of memory access to multiple caches flow.

FIG. 4 is a flow diagram depicting an exemplary embodiment of an application-specific partitioning of memory access to multiple caches flow 400. Flow 400 may be part of HLL compiler 202.

At 401 source code for an application is obtained. Source code may include one or more one or more lines of instructions which may after compilation be read or write instructions. It should be understood that source code may not actually call out a read or a write to memory until after such source code is compiled or assembled. At 403, a data flow graph is generated from source code parsed at 402. At 404, data dependencies are identified from the data flow graph.

At 405, memory accesses in the source code obtained at 401 are identified. These may include one or more memory read accesses, one or more memory write accesses, or a combination thereof.

If a read or a write memory access in HLL source code 201 is associated with processing data having dependencies, then at 406 such memory access is not assigned a separate cache or a separate memory space of a multi-ported cache of a distributed cache as described herein. Thus, for example, all such reads and writes with data dependencies may be excluded from being assigned separate cache at 406.

If, however, all the data of a read or a write memory access in HLL source code 201 is independent, namely no data dependency, then at 406 those memory accesses without data dependencies may be assigned to individual caches or may share one or more caches with non-overlapping memory spaces at 406. Of note, the data described as being cacheable in a separate cache or a separate memory space of a multi-ported cache is locally cacheable data. Furthermore, such locally cacheable data without data dependency is assigned a separate/non-shared cache, or assigned a non-overlapping/ separate memory space in a shared multi-ported cache for concurrent access. After memory accesses are assigned to caches at 406, at 407 HLL compiler 202 may complete the compilation of HLL source code 201 including assigning memory accesses to multiple caches responsive at least in part to the identified memory accesses having no data dependencies.

For application-specific partitioning of memory accesses to multiple caches for a design or application to be instantiated in an FPGA, cache may be assigned to each read and each write instruction provided there are no data dependencies associated therewith. In other words, for one or more read instructions without data dependencies cache may be allocated, and for each write instruction without data dependencies cache may be allocated. To maximize parallelism, independent memory accesses may be assigned to different caches. Allocation of such caches may be done by HLL compiler 202. Furthermore, allocation of such caches may be done in conjunction with use of HLL compiler 202 under guidance of a software programmer. For example, in embedded C code, a programmer may guide a compiler, such as HLL compiler 202, to allocate separate memory spaces for each array by explicitly specifying such allocations. Moreover, because such explicit specification may be done, a programmer may manually encode in HLL source code, such as HLL source code 201 of FIG. 2, the assignment of caches.

In order to further understand the assignment of caches, an example of vector addition is provided for purposes of clarity. The example of vector addition is provided for vectors A and B being added to provide a vector C for data 0 through 63, where i is incremented by 1, as indicated below:

for (i=0;i<64;i++)C[i]=A[i]+B[i];

In this code, a vector sum of A and B is calculated and the result C is stored. In this example, the reads from A and B originate from the same cache. Furthermore, the write of C is to the same cache from which A and B were previously read, as generally indicated in FIG. 3C.

A refinement would be to allocate three memory access instructions to different caches as arrays associated with vectors A and B, and resulting vector C are independent. Of note, it is assumed that the data associated with vectors A and B have no data dependencies. Accordingly, if data associated with vectors A and B are not data dependent, then resultant vector C in this example is likewise not data dependent. By assigning three separate caches, such as generally indicated in FIG. 3A, conflict between the three arrays associated with vectors A and B and vector sum C may be eliminated in comparison to obtaining all data for example one from a single cache and storing a result in such cache. By assigning three separate cache memories for data for vectors A, B, and C, respectively, parallelism of cache access is enhanced.

The following example is the same as the above example except it indicates the assignment of three separate cache memories as opposed to a same cache memory as in the prior example:

for (i=0;i<64;i++){C[i]=A[i]+B[i]; }

A CHiMPS instruction set for the above example for assigning separate memory accesses to independent caches may be as follows:
  read 0; 0; 4; A_addr; sync_in; sync_out
  read 1; 0; 4; B_addr; sync_in; sync_out
  write C_addr; C_value; 4; sync_in; sync_out
Furthermore, a CHiMPS instruction set for assigning memory accesses all to a single cache as in the first example may be as follows:
  read 1; 1; 4; A_addr; sync_in; sync_out
  read 1; 2; 4; B_addr; sync_in; sync_out
  write C_addr; C_value; 4; sync_in; sync_out Accordingly, with renewed reference to compilation flow 200 of FIG. 2, it should be appreciated that from HLL source code 201 to configuration bitstream 209, a single cache or multiple caches with complete independence or any combination therebetween, may be used for providing an application-specific partitioning of memory accesses for an application or design to be instantiated in an FPGA or an ASIC.

Of note, it is possible that data is shared between operations. Accordingly, there may be some coherency of data to be addressed as between caches. Such data coherency may be used to preserve for example coherency between caches, as well as between caches and main or system memory. For coherency, data may be broadcast to all caches and main memory. It should be understood that busing may be provided as part of a configuration bitstream 209 for purposes of data coherency among caches or among caches and main or system memory, or some combination thereof. However, data coherency will vary from application to application.

Figure 5:
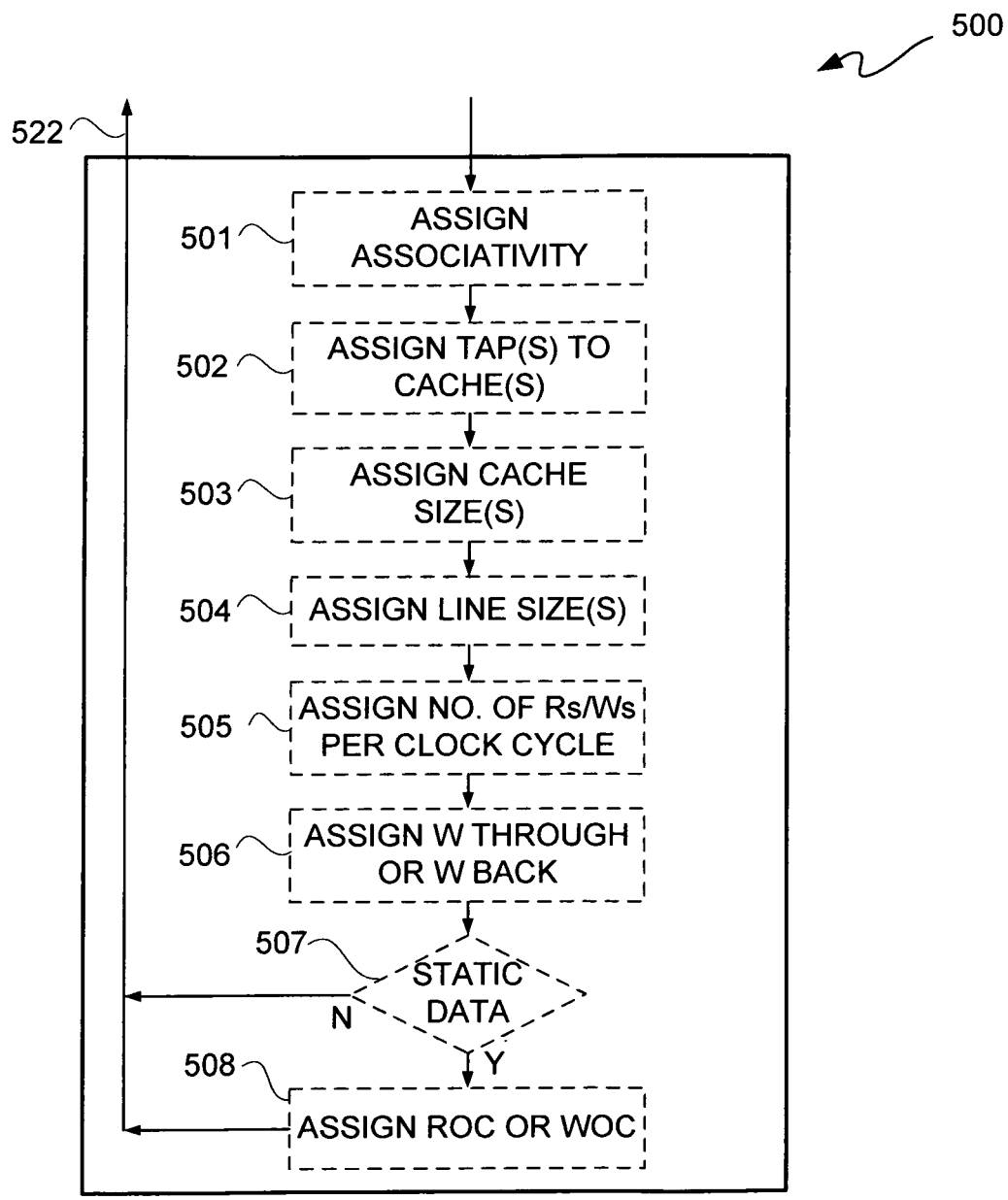
FIG. 5 is a flow diagram depicting an exemplary embodiment of a cache assignment flow.

FIG. 5 is a flow diagram depicting an exemplary embodiment of a cache assignment flow 500. Each of the operations of cache assignment flow 500 are illustratively shown with dashed lines to generally indicate such operations are programmable options for tailoring to an application.

Cache assignment flow 500 may be implemented in whole or in part for assigning caches as described above with reference to step 406 of flow 400 of FIG. 4. Cache assignment flow 500 facilitates a parameterized cache which may be tailored to a specific application, namely an application or design provided via HLL source code 201 that is to be compiled by HLL compiler 202 of FIG. 2. At 501, associativity of a cache or caches may be assigned. Associativity may include directly mapped caches, two-way associative caches, four-way associative caches, or other associativity. Again, like many other variables, associativity may vary from application to application.

At 502, one or more taps may be assigned to one or more caches. As previously mentioned, cache memory may be multi-ported, and thus read taps and write taps may be assigned. At 503, cache size may be assigned. Of note, the size of a cache may vary depending on the amount of data to be cached. With respect to BRAMs in an FPGA, such BRAMs may be concatenated to form larger memory spaces. However, for an ASIC, cache size may be assigned to accommodate specific data needs of an application.

At 504, one or more cache line sizes may be assigned. Cache line sizes may vary according to the number of words read out or written in during a burst. Furthermore, this will vary depending on the size, namely number of bits, of a word. Conventionally, burst length is set equal to line length. With respect to BRAMs in an FPGA, such BRAMs may be concatenated to form longer lines.

At 505, the number of reads or writes, or both, per clock cycle may be assigned. It should be appreciated that data may be segmented such that multiple reads or multiple writes, or both, occur in a single clock.

At 506, whether cache memory is to be used in a write-through or write-back mode may be set. At 507, it may be determined whether data associated with such cache is static data. An example of static data includes a fixed set of data completely contained within cache. Another example of static data includes a fixed set of data from which portions are moved from memory into and out of cache. In the latter example, data in cache may be changing; however, the set of data available to such cache for an application is static. If data is not static, then no assignment of any read only status is made, and cache assignment flow 500 is exited.

If, however, data is static, for operation of a design instantiated, then at 508 caches may be set to be read-only cache or write-only cache, as applicable. Continuing the above example, if the array of data associated with vector B is static, HLL compiler 202 may be used to instantiate a read-only cache for storing data associated with vector B. Accordingly, all logic and circuitry associated with supporting writes to such a cache may be removed. Likewise, if a cache is to be used as a write-only cache, circuitry associated with supporting reads from such cache may be removed.

Thus, output 522 of cache assignment flow 500 may include any of a variety of parameters associated with operations 501 through 506 and 508. Of note, not all operations 501 through 506 and 508 need be used. Furthermore, none of operations 501 through 506 and 508 need be used, as default values may be used. However, to provide a parameterized cache which more closely follows a specific application being compiled, cache assignment flow 500 may be used.

Thus, it should be appreciated that the above-described memory model of a distributed cache may be used to exploit data locality. Furthermore, the number of caches generated for such a distributed cache is not necessarily limited by the application, but rather may be limited by the number of embedded memories available with respect to implementation in an FPGA, and need not necessarily be limited with respect to an ASIC implementation.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for generating an architecture for a circuit, comprising:
    obtaining a description of an application written in a high-level programming language;
    generating a data flow representation from the description suitable for providing an implementation in hardware;
    the generating including:
    identifying accesses to memory associated with the description;
    determining that at least a portion of the accesses to locally cacheable data in the memory do not have one or more data dependencies for data referenced by any other of the accesses;
    compiling with a compiler the description for the identifying of the accesses to memory and the determining of the portion of the accesses to memory;
    producing an assembly language representation from the compiling;
    the assembly language representation indicating a distributed cache for a circuit implementation of the application;
    the assembly language representation indicating the accesses to memory as being either reads or writes;
    the assembly language representation indicating the distributed cache as having separate cache memory spaces for each of the accesses to memory of the portion; and
    assigning the portion of the accesses to memory to the distributed cache;
    assigning values to parameters that parameterize the distributed cache; and
    converting the data flow representation of the description and the distributed cache with the assigned parameter values into a hardware description language representation of the circuit.

2. The method according to claim 1, wherein the compiling includes assigning random access memories to the portion of the accesses to memory for providing the distributed cache.

3. The method according to claim 2, wherein at least one item of the portion of the accesses to memory is a read instruction; and wherein at least one other item of the portion of the accesses to memory is a write instruction.

4. The method according to claim 2, wherein a plurality of the portion of the accesses to memory are read accesses to memory; and wherein at least two of the read accesses to memory are associated with a same cache memory of the distributed cache with non-overlapping memory spaces and being capable of concurrent reading therefrom.

5. The method according to claim 4, wherein the cache memory is multi-read ported random access memory for executing the read accesses to memory concurrently; and wherein the read accesses to memory are for a same mathematical equation instantiated in the circuit.

6. The method according to claim 2, wherein the generating still further includes:
    assembling with an assembler the assembly language representation; and
    producing the data flow representation of the description from the assembling of the assembly language representation.

7. A system, comprising:
    a computer processor;
    a program storage medium readable by the computer processor, tangibly embodying a program of instructions executable by the computer processor to perform a method for generating a cache architecture for a circuit from a description of an application written in a high-level programming language, the method comprising:
    compiling the description to provide assembly language instructions associated therewith;
    outputting the assembly language instructions; and
    the compiling including:
    identifying data reads and data writes associated with the description;
    determining which of the data reads and the data writes to locally cacheable data do not include one or more data dependencies for data referenced by any other of the data reads and data writes;
    compiling with a compiler the description for the identifying of the accesses to memory and the determining of the portion of the accesses to memory;
    producing an assembly language representation from the compiling;
    the assembly language representation indicating a distributed cache for a circuit implementation of the application;
    the assembly language representation indicating the accesses to memory as being either reads or writes; and
    the assembly language representation indicating the distributed cache as having separate cache memory spaces for each of the accesses to memory of the portion; and
    assigning at least a portion of the data reads and the data writes without the one or more data dependencies to the separate cache memory spaces for associated accesses capable of being concurrent;
    assigning values to parameters that parameterize the separate cache memory spaces; and
    converting the assembly language instructions of the description and the separate cache memory spaces with the assigned parameter values into a hardware description language representation of the circuit.

8. The system according to claim 7, wherein the method further comprises:
    assembling the assembly language instructions from the compiling to provide a data flow representation of a circuit with cache memories for the cache memory spaces;

generating the hardware description language representation from the data flow representation; and outputting a configuration bitstream responsive to the hardware description language representation for instantiation of the circuit with the cache memories being random access memories in a programmable logic device.

9. A method for converting source code into a description of a circuit, comprising:

generating a spatial compilation from the source code suitable for providing an implementation in hardware with a distributed cache;

the generating including:

identifying accesses to memory associated with the source code;

determining which ones of the accesses to locally cacheable data in the memory do not include one or more data dependencies for data referenced by any other of the accesses;

compiling with a compiler the description for the identifying of the accesses to memory and the determining of the accesses to memory;

producing an assembly language representation from the compiling;

the assembly language representation indicating a distributed cache for a circuit implementation of the application;

the assembly language representation indicating the accesses to memory as being either reads or writes;

the assembly language representation indicating the distributed cache as having separate memories for each of the accesses to memory without the one or more data dependencies; and assigning at least a portion of the accesses to memory without the one or more data dependencies to the separate memories to provide the distributed cache;

assigning values to parameters that parameterize the distributed cache; and converting the spatial compilation and the distributed cache with the assigned parameter values into a hardware description language representation of the circuit.

10. The method according to claim 9, wherein the assigning of the portion of the accesses includes associating each access to memory of the portion of the accesses to memory with a separate random access memory.

11. The method according to claim 9, wherein the determining includes locating restricted data.

12. The method according to claim 9, further comprising:

locating which one or more accesses to memory of the portion of the accesses to memory use one or more sets of static data; and restricting a portion of the distributed cache for storing the static data as read-only access.

13. The method according to claim 9, further comprising providing a respective cache identifier for each cache memory of the distributed cache.

14. The method according to claim 9, further comprising assigning associativity to provide the distributed cache.

15. The method according to claim 9, wherein the source code is written for a single microprocessor memory model.

16. The method according to claim 9, further comprising:

assigning cache line size to provide the distributed cache; and assigning cache size to provide the distributed cache.

17. The method according to claim 9, further comprising assigning taps of multi-ported random access memories to provide the distributed cache.

18. The method of claim 1, wherein the generating a data flow representation includes generating the distributed cache to include at least a first cache for a first one of the accesses and a separate second cache for a second one of the accesses.

19. The method of claim 1, wherein the parameter values include values for one or more parameters including a type of cache associativity, a number of taps, a cache line size, a number of reads or writes per clock cycle, and an indicator of whether the distributed cache is a write-through cache or write back cache.

* * * * *